United States Patent
Okuda et al.

(10) Patent No.: US 8,203,112 B2
(45) Date of Patent: Jun. 19, 2012

(54) IMAGE SENSING DEVICE

(75) Inventors: Yoshiyuki Okuda, Hidaka (JP); Masakazu Nanba, Tokyo (JP); Norifumi Egami, Tokyo (JP); Akira Kobayashi, Hamamatsu (JP); Hideyuki Suzuki, Hamamatsu (JP); Sigeo Itoh, Mobara (JP); Masateru Taniguchi, Mobara (JP)

(73) Assignees: Pioneer Corporation, Tokyo (JP); Nippon Hoso Kyokai, Tokyo (JP); Hamamatsu Photonics K.K, Hamamatsu-Shi (JP); Futaba Corporation, Mobara-Shi (JP)

( * ) Notice: Subject to any disclaimer, the term of this patent is extended or adjusted under 35 U.S.C. 154(b) by 530 days.

(21) Appl. No.: 12/504,241

(22) Filed: Jul. 16, 2009

(65) Prior Publication Data
US 2010/0025568 A1    Feb. 4, 2010

(30) Foreign Application Priority Data
Jul. 16, 2008 (JP) .................. 2008-184596

(51) Int. Cl.
*H01L 31/02* (2006.01)
(52) U.S. Cl. .................. 250/214.1; 250/208.1

(58) Field of Classification Search ............... 250/208.1, 250/214.1; 315/169.2; 345/74.1, 75.2
See application file for complete search history.

(56) References Cited

U.S. PATENT DOCUMENTS

| | | | | |
|---|---|---|---|---|
| 5,488,386 A | * | 1/1996 | Yamagishi et al. | 345/74.1 |
| 7,834,308 B2 | * | 11/2010 | Namba et al. | 250/214.1 |
| 2006/0284683 A1 | * | 12/2006 | Ishii | 330/295 |

OTHER PUBLICATIONS

Tanaka, et al, Development of an active-matrix 'HEED' cold cathode and its application to an image sensor, Sep. 2006, IEEE, vol. 2, pp. 845-848.*

Tomonari Nakada et al., "Fabrication of active-matrix HEED (high-efficiency electron emission device) and its application to high-sensitivity image sensing", Pioneer R&D, 2007, vol. 17, No. 2.

* cited by examiner

*Primary Examiner* — Tony Ko
(74) *Attorney, Agent, or Firm* — Sughrue Mion, PLLC (57) ABSTRACT

A device includes an electron emission source array including a plurality of electron emission sources, a photoelectric conversion film disposed to face the electron emission source array, and an intermediate electrode provided between the electron emission source array and the photoelectric conversion film, and an intermediate electrode current detector that applies a positive potential, relative to a potential of the electron emission source array, to the intermediate electrode and detects a current flowing in the intermediate electrode.

6 Claims, 8 Drawing Sheets

IMAGE SENSING DEVICE

BACKGROUND OF THE INVENTION

1. Field of the Invention

The present invention relates to an image sensing device that includes an image sensor having both an array of electron emission sources and a photoelectric conversion film and a drive circuit that drives the image sensor.

2. Description of the Related Art

An image sensing device, which includes an image sensor having an array of electron emission sources arranged in a matrix, each outputting electrons through application of an electric field, and a photoelectric conversion film, has been proposed. For example, a High-efficiency Electron Emission Device (HEED) has been proposed as an electron emission source (specifically, as a cold cathode electron source) (for example, see Pioneer R&D, Vol. 17, No. 2, 2007, pp. 61-69).

The HEED enables low-voltage driving and features a simple structure, and studies are underway on application of HEEDs to image sensing devices. An example of the photoelectric conversion film is a High-gain Avalanche Rushing amorphous Photoconductor (HARP).

However, if a very bright image is incident on the photoelectric conversion film, an excessively large amount of hole charge is accumulated in one pixel area of the photoelectric conversion film, and the amount of electrons emitted by the electron emission source is insufficient to neutralize the accumulated holes, causing a problem of detected signal saturation when image information is read.

In addition, due to defective pixels of the cold cathode array, there is a problem, for example in that there is a pixel which cannot detect (or reproduce) an image signal since no or almost no electrons are emitted from the pixel or there is a pixel which causes signal saturation even though the brightness of incident light is normal since the amount of emitted electrons is less than a criterion value or a required value.

Such a defective pixel always becomes a black dot, which is obtrusive noise in terms of image quality. Thus, in the related art, a processor provided downstream for processing the reproduced signal performs so-called signal interpolation. That is, the processor calculates an average of the reproduced signals of left and right pixels or top, bottom, left, and right pixels and replaces the reproduced signal of the black-dot pixel with the average. However, in the related art, a pixel for interpolation is specified from the reproduced image and thus there is a problem in that it is difficult to determine whether the reason why the pixel is black is that the sensed image is black or that the pixel is defective. In addition, there is a problem in that correction is not performed on a pixel that suddenly becomes defective during use.

SUMMARY OF THE INVENTION

The present invention has been made in view of the above problems, and it is an object of the present invention to provide an image sensing device that can correctly detect a defective pixel such as an irregular electron emission pixel of a cold cathode array or a residue charge pixel of a photoelectric conversion film. For example, the present invention provides a high-image-quality, high-performance, high-reliability image sensing device which can correctly perform electron emission control and sensed image data interpolation processing based on the information of the detected pixel.

In accordance with the present invention, the above and other objects can be accomplished by the provision of an image sensing device which includes an electron emission source array including a plurality of electron emission sources arranged in a matrix, a photoelectric conversion film disposed to face the electron emission source array, and an intermediate electrode provided between the electron emission source array and the photoelectric conversion film, wherein the image sensing device outputs, as an image signal, a photoelectric conversion current generated by combination of holes in the photoelectric conversion film through incidence of light thereon and part of electrons emitted from the electron emission source array toward the photoelectric conversion film, the image sensing device further including an intermediate electrode current detector that applies a positive potential, relative to a potential of the electron emission source array, to the intermediate electrode and detects a current flowing in the intermediate electrode.

According to one aspect of the invention, the intermediate electrode current detector detects a current flowing in the intermediate electrode corresponding to each of the electron emission sources in synchronization with a clock signal that is provided to perform dot sequential scanning of each of the electron emission sources.

According to another aspect of the invention, the image sensing device further includes a residue hole identifier that identifies an electron emission source that emits a smaller amount of electrons than an amount of holes generated in the photoelectric conversion film based on both the current flowing in the intermediate electrode and the current flowing in the photoelectric conversion film.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

The embodiments of the present invention will now be described with reference to the drawings.

Figure 1:
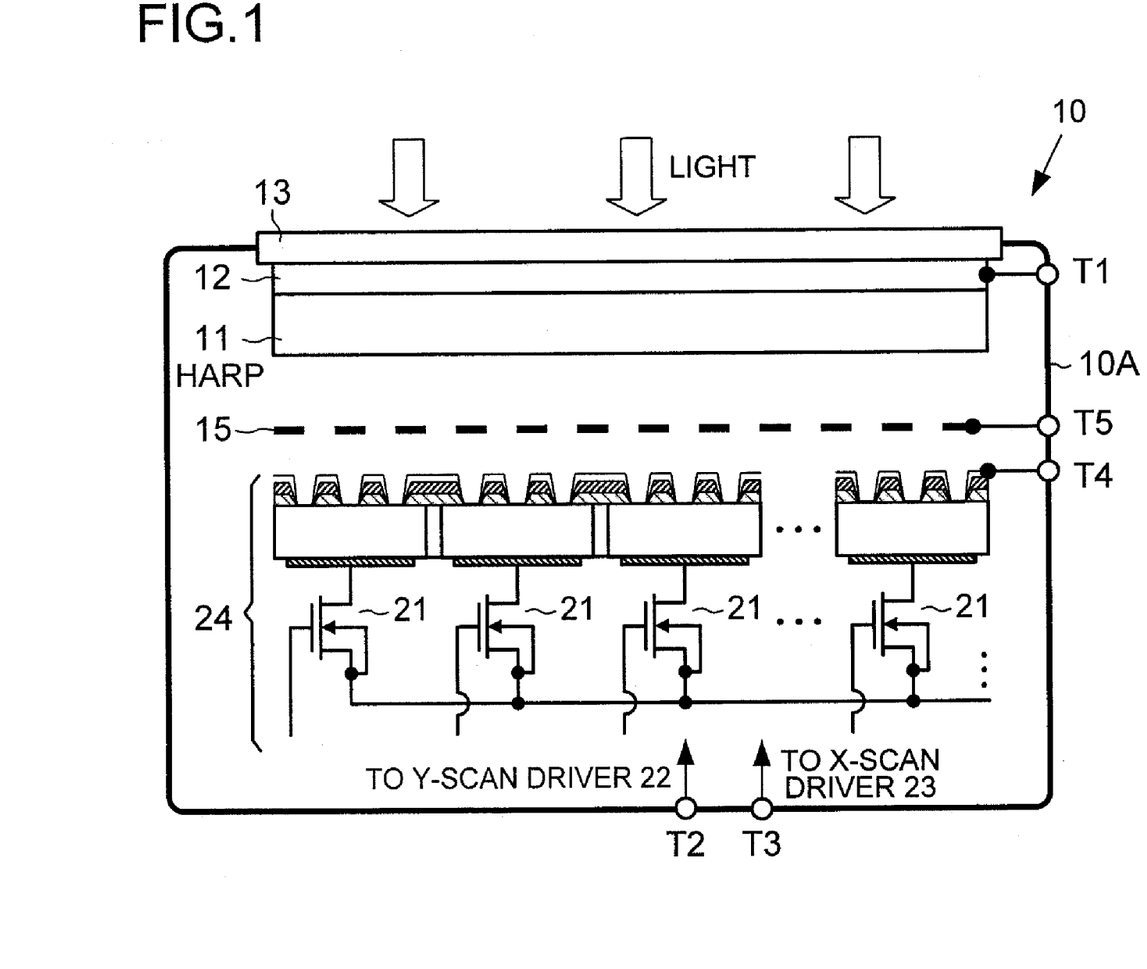
FIG. 1 is a cross-sectional view schematically illustrating a configuration of an HEED cold cathode HARP image sensor.

FIG. 1 is a cross-sectional view schematically illustrating a configuration of an HEED cold cathode HARP image sensor 10. The HEED cold cathode HARP image sensor 10, which will hereinafter also be referred to as a "cold cathode image sensor" for short, is an image sensor which combines a High-efficiency Electron Emission Device (HEED) with a High-gain Avalanche Rushing amorphous Photoconductor (HARP). In more detail, the cold cathode image sensor 10 includes an HARP photoelectric conversion film 11, an HEED cold cathode array chip 24, and a mesh electrode (intermediate electrode) 15 which is disposed between the HARP photoelectric conversion film 11 and the HEED cold cathode array 20. As described later, the HEED cold cathode array chip 24 integrally includes an active-matrix HEED cold cathode array 20, which will hereinafter be referred to as an "HEED cold cathode array" for short, and a Y-scan driver 22 and an X-scan driver 23 which are not shown in FIG. 1. Although the embodiments are described with reference to the case where a photoelectric conversion film having an HARP structure and a cold cathode array having an HEED structure are used, these are only illustrative and a photoelectric conversion film having a different structure and a cold cathode having a different structure may also be used.

As shown in FIG. 1, the HARP photoelectric conversion film 11 is formed on a transparent conductive layer 12 and the transparent conductive layer 12 is formed on the transparent substrate 13. The HARP photoelectric conversion film 11 includes amorphous selenium (Se) as a main component and may also include another substance or material, for example, silicon (Si), a compound semiconductor such as lead oxide (PbO), cadmium selenium (CdSe), or gallium arsenide (GaAs). The transparent conductive layer 12 may be formed of a tin oxide ($SnO_2$) layer or an Indium Tin Oxide (ITO) layer. As described later, a predetermined positive voltage, which will also be referred to as an HARP potential or an HARP voltage, is applied to the transparent conductive layer 12 via a connection terminal (input/output terminal) T1 provided on a glass housing 10A.

The transparent substrate 13 may be formed of a substance that transmits light having wavelengths that are sensed by the cold cathode image sensor 10. For example, the transparent substrate 13 is formed of a substance such as glass that transmits visible light when the cold cathode image sensor 10 performs image sensing using visible light, and is formed of a substance such as sapphire or quartz glass that transmits ultraviolet light when the cold cathode image sensor 10 performs image sensing using ultraviolet light. In addition, the transparent substrate 13 is formed of a substance that transmits x-rays, such as beryllium (Be), silicon (Si), boron nitride (BN), or aluminum oxide ($Al_2O_3$) when the cold cathode image sensor 10 performs image sensing using x-rays.

The mesh electrode 15 has a plurality of openings and is formed of a substance such as a known metal substance, an alloy, or a semiconductor substance. A predetermined positive voltage, which will also be referred to as a mesh voltage or a mesh potential, is applied to the mesh electrode 15 via a connection terminal T5. The mesh electrode is an intermediate electrode provided for accelerating electrons and collecting surplus electrons.

As described later, gate electrodes of Metal Oxide Semiconductor (MOS) transistors, which drive the HEED, in the HEED cold cathode array 20 are connected to the X-scan driver 23, which is a horizontal scanning circuit, and source electrodes (S) thereof are connected to the Y-scan driver 22, which is a vertical scanning circuit, such that dot sequential scanning is performed through the X-scan driver 23 and the Y-scan driver 22. The Y-scan driver 22 and the X-scan driver 23 are constructed as a single chip integrally with the HEED cold cathode array 20 on the HEED cold cathode array chip 24 and are provided inside the glass housing 10A although not illustrated. Signals or voltages required to drive the HEED cold cathode array chip 24 are provided to the HEED cold cathode array chip 24 through connection terminals (input/output terminals) T2, T3, and T4 provided on the glass housing 10A.

All of these components are vacuum-encapsulated within the glass housing 10A sealed in frit glass or indium metal.

Figure 2:
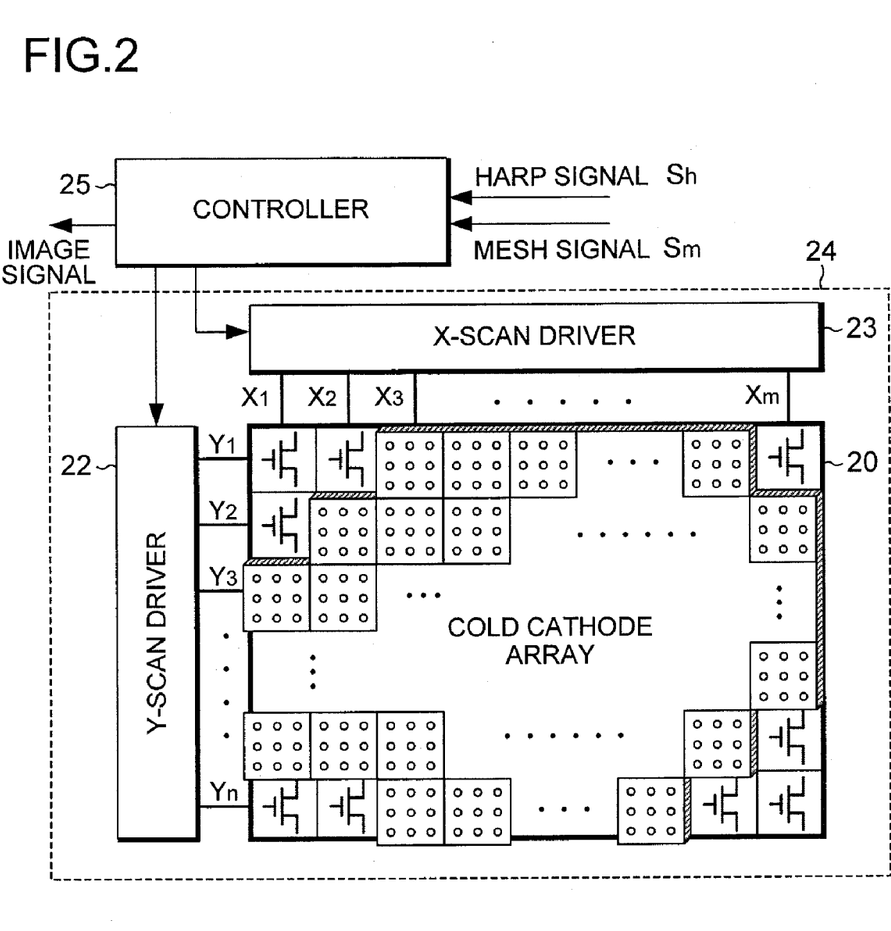
FIG. 2 is a block diagram illustrating a configuration of an HEED cold cathode array, a Y-scan driver and an X-scan driver that drive the HEED cold cathode array, and a controller that controls all components of the device.

FIG. 2 is a block diagram illustrating configurations of the HEED cold cathode array 20, the Y-scan driver 22 and the X-scan driver 23 that drive the HEED cold cathode array 20, and the controller 25 that controls all components of the device. The Y-scan driver 22 and the X-scan driver 23 are integrally constructed as the single HEED cold cathode array chip 24. The controller 25 or other circuits described later may also be mounted on the chip.

As schematically shown in FIG. 2, the HEED cold cathode array 20 is constructed as an active-matrix Field Emitter Array (FEA) by integrally mounting an HEED cold cathode array directly on a drive circuit LSI that is formed on an Si wafer, and allows high-speed driving for image sensing operations (for example, operations with a drive pulse width of 10 ns per pixel) in which dot sequential scanning is performed. The HEED cold cathode array 20 includes a plurality of pixels (n×m pixels) arranged in a matrix having n rows and m columns that are connected to scan drive lines including n lines and m lines that are arranged respectively in the Y direction (i.e., the vertical direction) and the X direction (i.e., the horizontal direction). For example, the HEED cold cathode array 20 is constructed as a high-precision HEED cold cathode array of 640×480 pixels (i.e., VGA).

The Y-scan driver 22 and the X-scan driver 23 perform dot sequential scanning and pixel driving based on control signals such as a vertical synchronization signal (V-Sync), a horizontal synchronization signal (H-Sync), and a clock signal (CLK) from the controller 25. That is, the Y-scan driver 22 and the X-scan driver 23 perform dot sequential scanning such that the Y-scan driver 22 sequentially scans the scan lines (Yj, j=1, 2, . . . , n) in the Y direction and, when one scan line (Yk) is selected, the X-scan driver 23 sequentially scans the line (Xi, i=1, 2, . . . , m) in the X direction to select and drive each pixel on the scan line (Yk).

Figure 3:
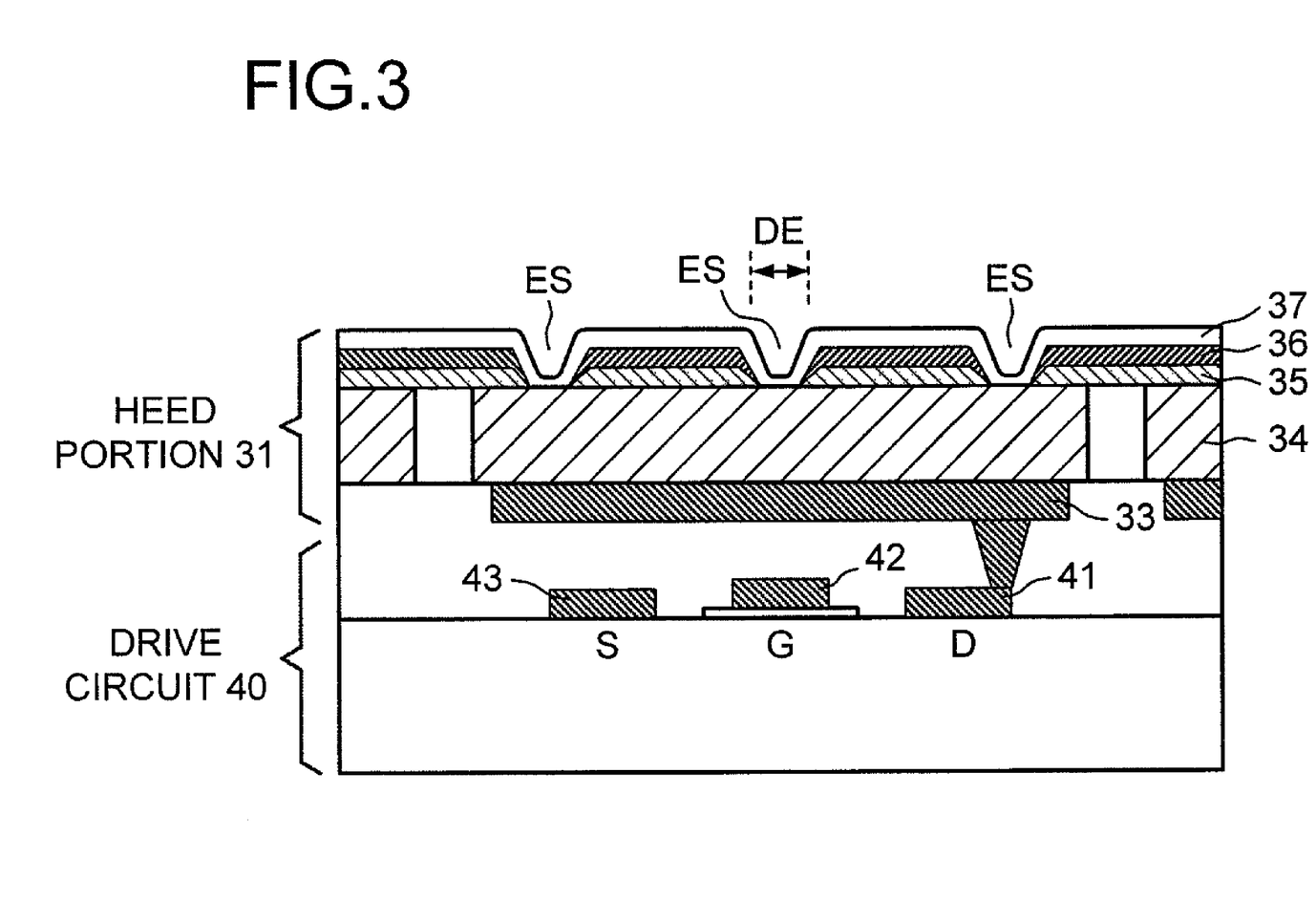
FIG. 3 is a partial cross-sectional view schematically illustrating an enlarged pixel portion of the active-matrix HEED cold cathode array to explain the structure of the active-matrix HEED cold cathode array.

FIG. 3 is a partial cross-sectional view schematically illustrating an enlarged pixel portion of the active-matrix HEED cold cathode array 20 to explain the structure of the active-matrix HEED cold cathode array. The HEED cold cathode array 20 includes a drive circuit 40 and an HEED portion 31 which is formed on the top of the drive circuit 40 including a MOS transistor array after the drive circuit 40 and Y-scan and X-scan drivers 22 and 23 that drive and control the drive circuit 40 are formed.

As shown in FIG. 3, the HEED portion 31 is a Metal Insulator Semiconductor (MIS) cold cathode electron emission source that has a layered structure including a lower electrode 33, a silicon (Si) layer 34, a silicon oxide ($SiO_x$) layer 35, an upper electrode 36 formed of, for example, tungsten (W), and a carbon (C) layer 37. The upper electrode 36 of the HEED cold cathode array 20 is common to all pixels and the lower electrode 33 and the Si layer 34 are divided to electrically separate the pixels from each other.

The lower electrode 33 of the HEED portion 31 is connected to a drain electrode D of a MOS transistor of the drive circuit 40 through a via hole. As described above, a gate electrode G and a source electrode S of the MOS transistor are connected to the X-scan driver 23 and the Y-scan driver 22.

Switching of each pixel that emits electrons is performed by controlling the drain potential of the MOS transistor, i.e., the potential of the lower electrode 33 of each pixel of the HEED portion 31.

The number of pixels of the HEED cold cathode array 20 is, for example, 640×480 (VGA) and the size of one pixel is 20×20 μm². Emission sites ES, which are openings for electron emission, are formed in the surface portion of one pixel. For example, 3×3 emission sites ES having a diameter DE of about 1 μm (i.e., 3×3 1 μm φ emission sites ES) are formed in an 8×8 μm² area of one pixel. For example, an electron current of several microamperes (μA) is emitted (in an electron density of about 4 A/cm²) through one emission site ES. Such numerical values described in this embodiment are only illustrative and may be appropriately changed according to the type of an apparatus that uses the image sensor, the resolution or sensitivity of the image sensor, or the like.

Configuration and Operation of Image Sensing Device

Figure 4:
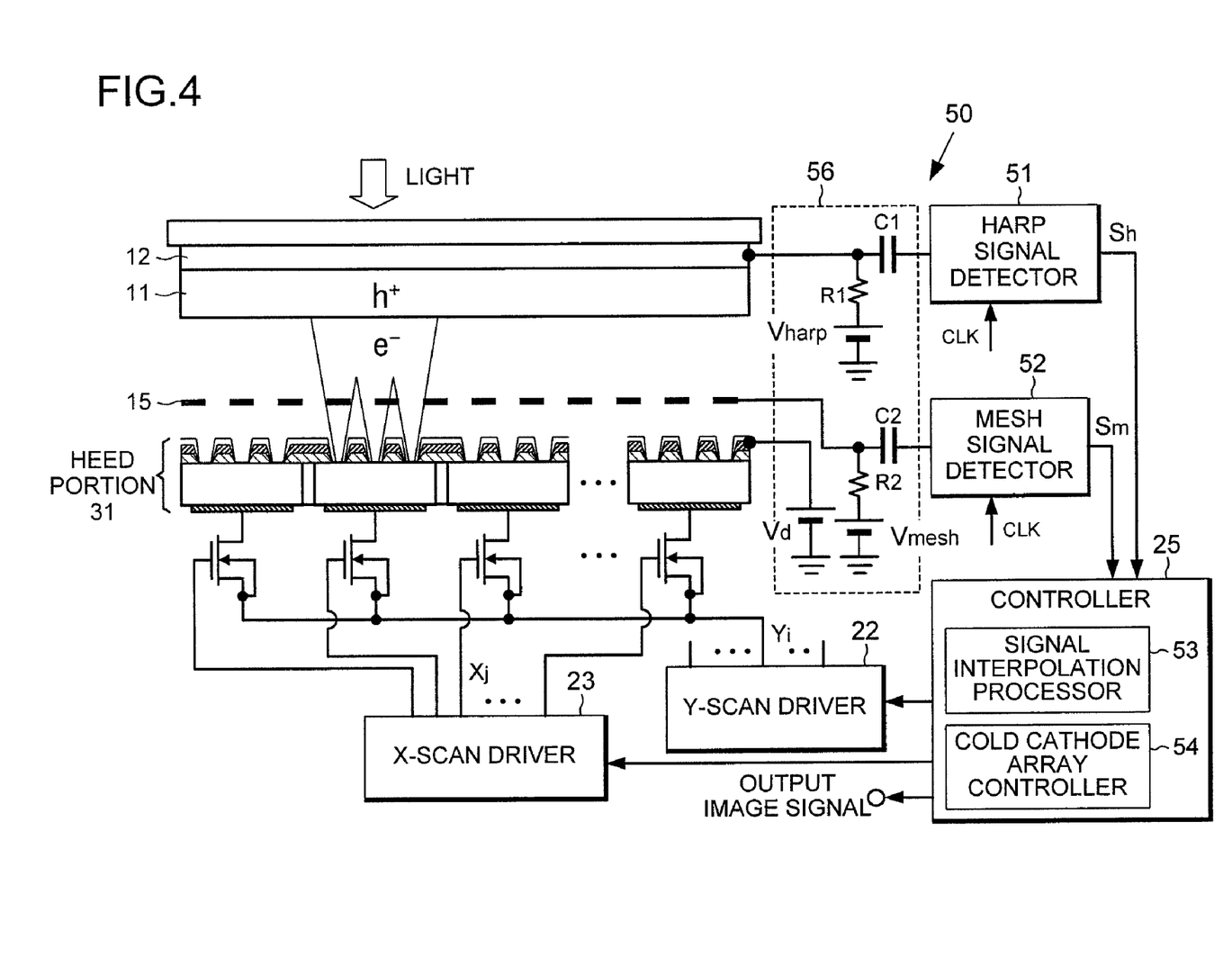
FIG. 4 schematically illustrates a configuration of an image sensing device of the embodiment.

FIG. 4 schematically illustrates a configuration of an image sensing device 50 of the embodiment. The image sensing device 50 includes an HARP signal detector 51, which is a photoelectric conversion signal detector, and a mesh electrode signal detector (hereinafter referred to as a "mesh signal detector") 52. The image sensing device 50 also includes a signal interpolation processor 53 and a cold cathode array controller 54. Although it is schematically shown in FIG. 4 that the signal interpolation processor 53 and the cold cathode array controller 54 are provided as a part of a controller 25, the signal interpolation processor 53 and the cold cathode array controller 54 may, of course, be provided separately from the controller 25. An HARP. signal and a mesh electrode signal detected by the HARP signal detector 51 and the mesh signal detector 52 are provided to the controller 25.

As shown in FIG. 4, an external power supply circuit 56 is connected to a transparent conductive layer 12 and is constructed such that a predetermined positive voltage (HARP voltage) Vharp is applied to an HARP photoelectric conversion film 11 and an HARP signal is provided to the HARP signal detector 51 through a capacitor C1. The external power supply circuit 56 is also constructed such that a predetermined positive voltage (mesh voltage) Vmesh is applied to a mesh electrode 15 and a mesh electrode signal, which will also be referred to as a "mesh signal", is provided to the mesh signal detector 52 through a capacitor C2. The external power supply circuit 56 is also constructed such that a predetermined positive voltage (HEED drive voltage) Vd is applied to an upper electrode 36 of an HEED portion 31. For example, the voltage values are such that Vharp=1.5 kV, Vmesh=470V, and Vd=23V. However, the present invention is not limited to these voltage values.

Next, a description is given of the operation of the image sensing device 50. When external light is incident on the HARP photoelectric conversion film 11 through the transparent conductive layer 12, pairs of electrons and holes are generated according to the amount of the incident light at an inner portion of the HARP photoelectric conversion film 11 adjacent to the transparent conductive layer 12. Among the pairs of electrons and holes, the holes are accelerated by a high electric field, which is applied to the HARP photoelectric conversion film 11 through the transparent conductive layer 12, and then successively collide with atoms included in the HARP photoelectric conversion film 11 to generate new pairs of electrons and holes. The holes generated through avalanche multiplication are accumulated on one side of the HARP photoelectric conversion film 11 which faces the HEED cold cathode array 20 (i.e., the side of the HARP photoelectric conversion film 11 opposite to the transparent conductive layer 12), thereby forming a hole pattern corresponding to the incident optical image. A current generated when the holes combine with electrons emitted by the HEED cold cathode array 20 is detected as an image signal corresponding to the incident optical image.

The controller 25 performs cold cathode array control and signal processing based on an HARP signal Sh and a mesh signal Sm detected by the HARP signal detector 51 and the mesh signal detector 52. The components of the image sensing device 50, including a Y-scan driver 22, an X-scan driver 23, the HARP signal detector 51, the mesh signal detector 52, and the controller 25, operate based on (i.e., in synchronization with) a clock signal (CLK) and perform the variety of operations described herein such as detection of a variety of signals, control of the drivers, signal processing.

Based on the HARP signal Sh and the mesh signal Sm from the HARP signal detector 51 and the mesh signal detector 52, the controller 25 identifies (or determines) an area of pixels of the HARP photoelectric conversion film 11 in which holes are remaining (hereinafter referred to as "residue charge pixels") and also identifies pixel(s) of the HEED cold cathode array 20 which do not emit electrons or which emit a smaller amount of electrons than an amount corresponding to a criterion value or a required value (ε) (hereinafter referred to as "non-electron-emission pixels").

Figure 5:
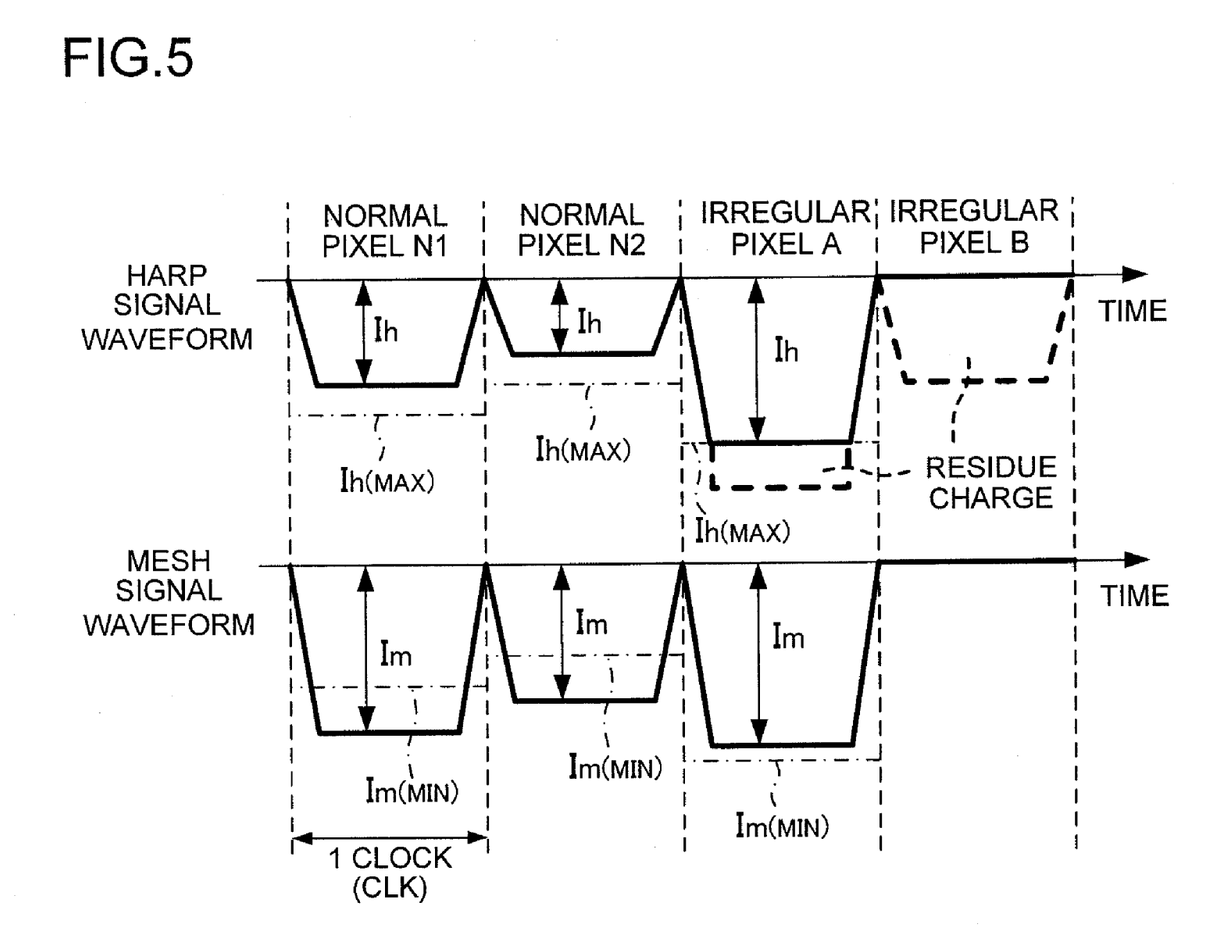
FIG. 5 schematically illustrates an HARP signal waveform and a mesh signal waveform, i.e., changes of currents of the HARP photoelectric conversion film and the mesh electrode.

FIG. 5 schematically illustrates an HARP signal waveform and a mesh signal waveform, i.e., changes of currents of the HARP photoelectric conversion film 11 and the mesh electrode 15. In the following description, it is assumed that (the absolute values of) the currents of the HARP photoelectric conversion film 11 and the mesh electrode 15 are an HARP current Ih and a mesh current Im, respectively. It is preferable that the following method be used to detect and identify irregular or defective pixels such as residue charge pixels or non-electron-emission pixels although various other methods may also be used.

The HARP current Ih varies according to the amount (i.e., brightness) of light incident on each pixel and the mesh current Im varies according to the amount of electrons emitted from each pixel of the HEED cold cathode array 20. The HARP current Ih and the mesh current Im also vary according to the electron transmittance rate (κ) of the mesh electrode 15. The electron transmittance rate (κ) is a value that defines the rate of transmittance of electrons of the mesh electrode. A known value that is almost constant in the surface as a mesh opening area rate is used as the electron transmittance rate (κ). Alternatively, a distribution may be obtained for each location through experiments or the like and then may be used as the electron transmittance rate (κ), instead of the known value. Here, a relation of Ih=Ih(MAX) or Im=Im(MIN) is satisfied in the residue charge pixels. However, in reality, it is difficult to detect only the state that satisfies such relations due to problems such as noise. Accordingly, practically, it is preferable to set appropriate ranges for identification of such pixels (specifically, a range greater than a threshold value of Ih(th) obtained by multiplying Ih(MAX) by a predetermined factor and a range smaller than a threshold value of Im(th) obtained by multiplying Ih(MIN) by a predetermined factor) as shown in the following expressions. Accordingly, it is preferable to determine the criterion values Ih(th) and Im(th) based on the following expressions and then to identify a residue charge pixel and a non-electron-emission pixel based on the determined criterion values.

$$Ih + Im = Ie \quad (1)$$

$$Ie \times \kappa = Ih(MAX), Ie \times (1-\kappa) = Im(MIN) \quad (2)$$

$$0.9 \times Ih(MAX) = Ih(th), 1.1 \times Im(MIN) = Im(th) \quad (3)$$

The following are determination equations for identification.

$$Ih > Ih(th) \text{ or } Im < Im(th) \qquad (4)$$

$$Ie < \epsilon \qquad (5)$$

In addition, in this embodiment, a lower limit of a readable current value is defined as "$\epsilon$".

For example, it is possible to identify a pixel that satisfies the determination equation (4) as a residue charge pixel (which will hereinafter be referred to as an "irregular pixel type A" or a "pixel A"). It is also possible to identify a pixel that satisfies the determination equation (5) as a non-electron-emission pixel which emits a smaller amount of electrons than an amount corresponding to the criterion value ($\epsilon$) (which will hereinafter be referred to as an "irregular pixel type B" or a "pixel B"). This pixel also satisfies the determination equation (4). The factors used in Equation (3) are not limited to 0.9 and 1.1. Although pixels that satisfy the above reference expressions for identification may include normal pixels, the expressions have been determined taking into consideration balance between circuitry stability and exclusion of influence of noise.

Although it is preferable that the process for detecting whether or not a residue charge pixel and a non-electron-emission pixel are present and performing correction when they are present be performed every image frame in terms of image quality, the frame interval at which the process is performed is not limited to one frame. For example, the process may be performed once per a number of frames determined according to circuitry size or processing capabilities.

Since such detection is performed every pixel, it is possible to perform the correction operation during a horizontal blanking period immediately after detection. It is also possible to perform the correction operation over a plurality of horizontal blanking periods after detection to improve the effect of removal of residue charge.

The following is a more detailed description of the method for identifying a residue charge pixel and a non-electron-emission pixel with reference to FIG. 5. As shown in FIG. 5, in the case of a normal pixel (N1), the amount (brightness) of incident light is large and a large amount of charge is produced. In this case, the current value Ie (=Ih+Im) is relatively large. That is, although the criterion value Im(th) is large, the amount of emitted electrons is sufficient and the current value Ih is equal to or less than the criterion value Ih(th) (i.e., Ih<Ih(th)), and thus it is possible to determine that the pixel is normal while no residual charge is produced.

In the case of a normal pixel (N2), the amount of generated charge is smaller and the amount of emitted electrons is smaller, compared to the pixel (N1). In this case, the current value Ie (=Ih+Im) is small compared to the case of the pixel (N1). That is, the criterion value Im(th) is small, the current value Im is equal to or greater than the criterion value Im(th) (i.e., Im≧Im(th)), and the amount of emitted electrons is sufficient. In addition, the criterion value Ih(th) is small, compared to the case of the pixel (N1). However, the current value Ih is equal to or less than the criterion value Ih(th) (i.e., Ih≦Ih(th)), and thus it is possible to determine that the pixel is normal while no residue charge is produced.

As shown in FIG. 5, in the case of an irregular pixel A, the amount (brightness) of incident light is large and the amount of emitted electrons is large, but the amount of emitted electrons is not sufficient so that residue charge is produced (i.e., Ih>Ih(th) and Im<Im(th)). In the case of an irregular pixel B, the amount of emitted electrons is small (Ie<$\epsilon$) and thus residue charge is produced. These pixels can be determined to be irregular.

The method for detecting and identifying a residue charge pixel and/or a non-electron-emission pixel is not limited to that described above. For example, the current value Ie (=Ih+Im) may be calculated and then presence or absence of residue charge may be determined and non-electron-emission pixel may be identified based on whether or not the current value exceeds a predetermined criterion value.

Figure 6:
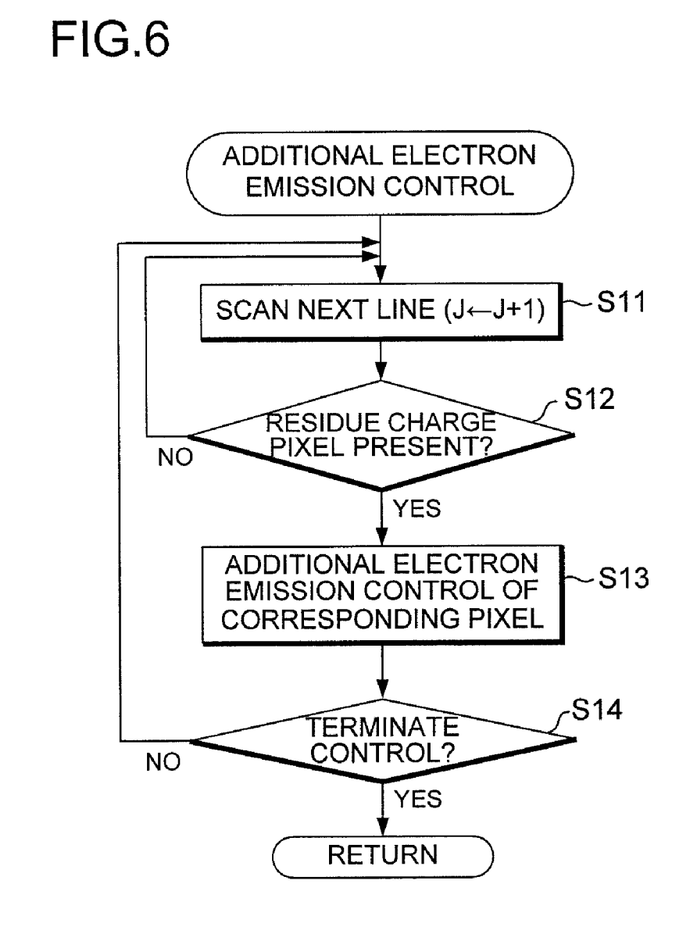
FIG. 6 is a flow chart illustrating how an additional electron emission control operation is performed under control of the controller.
Figure 7:
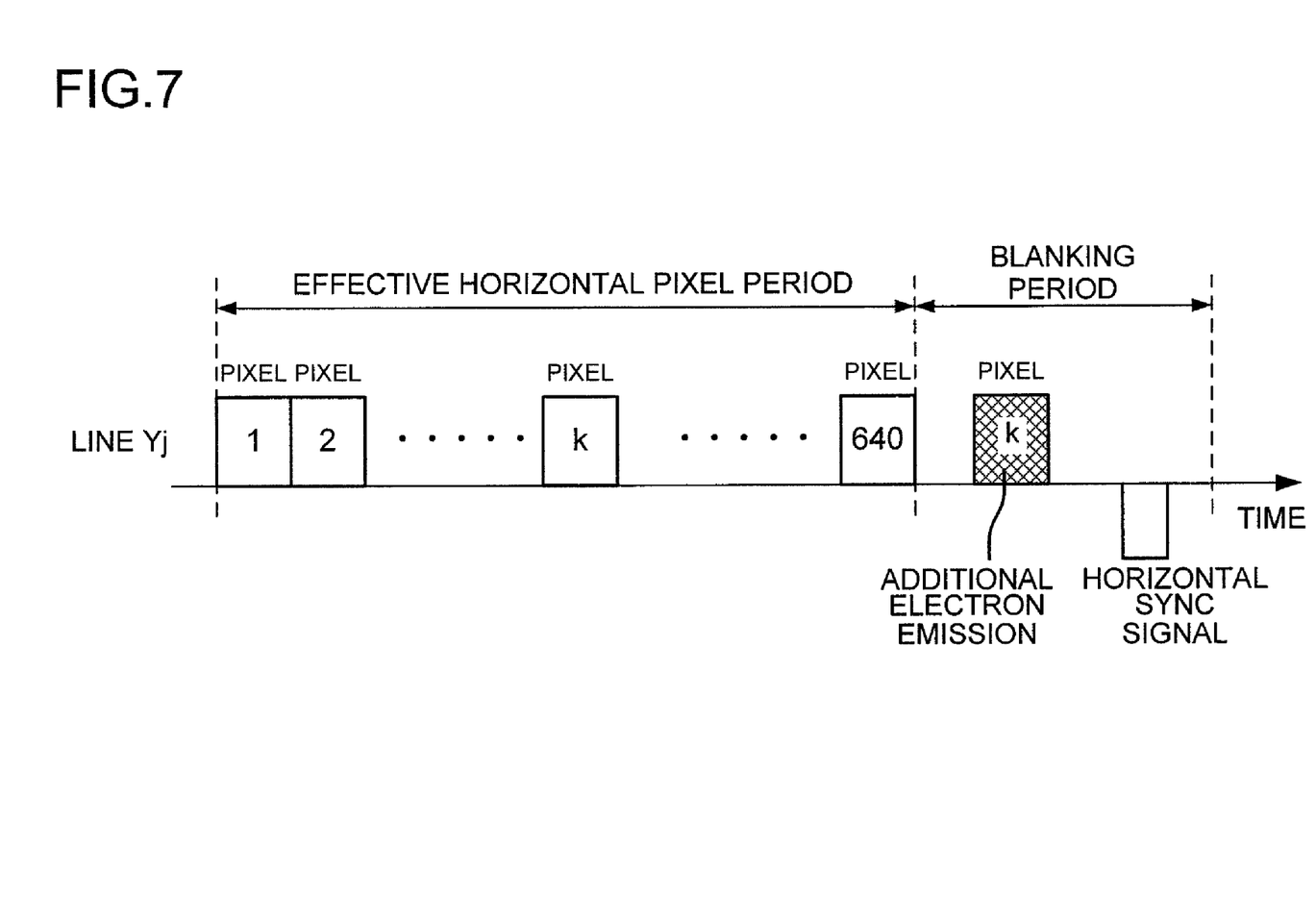
FIG. 7 schematically illustrates the operation of the controller and the additional electron emission operation in the case where dot sequential scanning is performed on pixels 1 to m of a scan line Yj in the X direction (i.e., the horizontal direction)

FIG. 6 is a flow chart illustrating how an additional electron emission control operation is performed under control of the controller 25. FIG. 7 schematically illustrates the operation of the controller 25 and the additional electron emission operation in the case where dot sequential scanning is performed on pixels 1 to m (m=640 in this example) of a scan line Yj in the X direction (i.e., the horizontal direction).

First, when dot sequential scanning is performed on a scan line Yj (step S11) (j=1 when an image frame starts), the controller 25 determines whether or not each of the pixels 1 to 640 of the scan line Yj arranged along the horizontal direction is a residue charge pixel in an effective horizontal image period (step S12) and stores the location of a pixel that has been determined to be a residue charge pixel (i.e., the address of the pixel, specifically, the row and column numbers thereof). The controller 25 returns to step S11 to perform the above procedure on a next scan line when it has been determined at step S12 that no residue charge pixel is present among the pixels of the scan line.

When it has been determined that a residue charge pixel is present, the controller 25 controls the cold cathode array controller 54 to perform additional electron emission of a pixel of the HEED cold cathode array 20 corresponding to the pixel which has been determined to be a residue charge pixel in the image blanking period after scanning of the scan line (Yj) (step S13). For example, when a kth pixel of the scan line has been determined to be a residue charge pixel, the cold cathode array controller 54 performs additional electron emission of the k-th pixel of the scan line (Yj) of the HEED cold cathode array 20 in the blanking period.

Although additional electron emission is performed on the residue charge pixel in the example described above, additional electron emission may also be performed on a pixel located near the residue charge pixel, for example, on a pixel vertically or horizontally adjacent to the residue charge pixel.

The controller 25 then determines whether or not to terminate the additional electron emission control (step S14). When the controller 25 has determined to continue the additional electron emission control, it returns to step S11 to repeat the same residue charge pixel identification and additional electron emission control as described above on the next scan line Yj (j=j+1). The controller 25 terminates this routine when it has determined to terminate the additional electron emission control at step S14.

Figure 8:
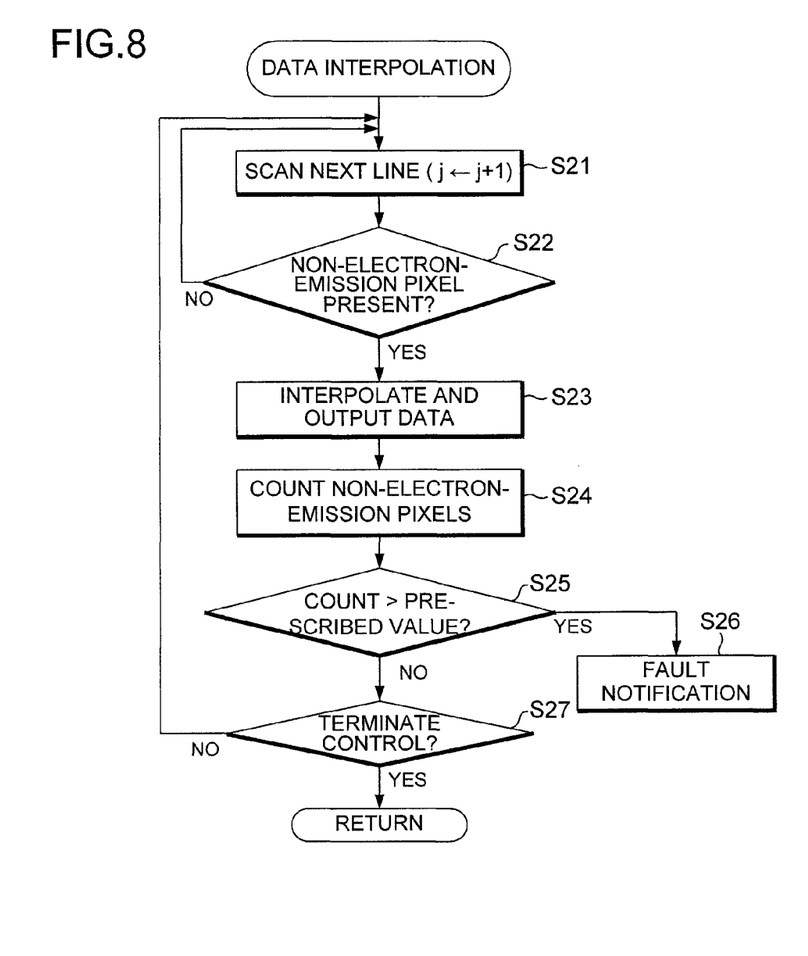
FIG. 8 is a flow chart illustrating a procedure for performing data interpolation processing under control of the controller.

FIG. 8 is a flow chart illustrating a procedure for performing data interpolation processing under control of the controller 25. First, the controller 25 performs dot sequential scanning of a scan line Yj (j=1 when an image frame starts) (step S21). The controller 25 then determines whether or not each of the pixels 1 to 640 of the scan line Yj arranged along the horizontal direction is a non-electron-emission pixel and stores the location (i.e., address) of a pixel that has been determined to be a non-electron-emission pixel (step S22).

When a non-electron-emission pixel is detected, the controller 25 controls the signal interpolation processor 53 to perform signal interpolation processing. The signal interpolation processor 53 performs interpolation processing on brightness data of the non-electron-emission pixel using data regarding brightness (the amount of light) of the pixels adjacent to the non-electron-emission pixel in the vertical and/or horizontal direction of the non-electron-emission pixel. The controller 25 also includes a memory (not shown) that stores sensed image data. The controller 25 outputs data interpolated by the signal interpolation processor 53 as a sensed image data signal which will also be referred to as an "image signal" (step S23).

The controller 25 then counts the number of non-electron-emission pixels (irregular pixels) (step S24) and determines whether or not the counted number exceeds a prescribed value (step S25). When the counted number exceeds the prescribed value, the controller 25 performs fault notification, for example by displaying information indicating fault notification on a display (step S26).

When it has been determined at step S25 that the counted number does not exceed the prescribed value, the controller 25 determines whether or not to terminate the interpolation processing control (step S27). When the controller 25 has determined to continue the interpolation processing control, it returns to step S21 to repeat the same procedure as described above on the next scan line. The controller 25 terminates this routine when it has determined to terminate the interpolation processing control at step S27.

Although the procedure for additional electron emission control and the procedure for data interpolation processing control have been individually described, the two control procedures may, of course, be combined for application.

Although the HEED cold cathode array has been described as an example of the cold cathode array and the HARP photoelectric conversion film has been described as an example of the photoelectric conversion film in the above embodiment, the present invention may also be applied to an image sensing device using any of various other types of cold cathode arrays and photoelectric conversion films. Substances or materials and numerical values illustrated in the above embodiment are only illustrative.

As described above, the present invention uses a signal of a mesh electrode provided between an image sensing surface formed of a photoelectric conversion film such as an HARP photoelectric conversion film and a cold cathode array that is disposed facing the photoelectric conversion film with a vacuum space formed therebetween. That is, in the related art, the mesh electrode is merely applied with a constant voltage and is merely used to accelerate emitted electrons and to collect surplus electrons. In the present invention, a current (i.e., a mesh signal) accompanied by the collection of surplus electrons is detected, and, with reference to the detected mesh signal together with a photoelectric conversion signal obtained at the photoelectric conversion film, it is possible to correctly identify residue charge pixels of the photoelectric conversion film and defective pixels of the cold cathode array and to correctly determine the amount of emitted electrons, a variation thereof, the degree of degradation, etc., of each pixel.

As described above in detail, it is possible to correctly detect irregular pixels of the cold cathode array and residue charge pixels of the photoelectric conversion film using a signal of the mesh electrode. It is also possible to correctly perform additional electrode emission control and/or interpolation processing of sensed image data (i.e., an image signal) based on information of the detected pixels. That is, it is possible to perform additional electron emission only on pixels, which emit a smaller amount of electrons than a prescribed value or criterion value and thus require additional electron emission, thereby achieving advantages such as an increase in the life of the cold cathode and reduction of surplus electrons. It is also possible to realize a high-image-quality, high-performance image sensing device which eliminates or reduces white defects or gray-scale saturation. Accordingly, it is possible to achieve improvement of image quality and resolution and improvement of the reliability and life of the image sensing device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

This application is based on Japanese Patent Application No. 2008-184596 which is hereby incorporated by reference.

What is claimed is:

1. An image sensing device comprising:
    an electron emission source array including a plurality of electron emission sources arranged in a matrix,
    a photoelectric conversion film disposed to face the electron emission source array, and
    an intermediate electrode provided between the electron emission source array and the photoelectric conversion film,
    wherein the image sensing device outputs, as an image signal, a photoelectric conversion current generated by combination of holes in the photoelectric conversion film through incidence of light thereon and part of electrons emitted from the electron emission source array toward the photoelectric conversion film,
    the image sensing device further comprising:
    an intermediate electrode current detector that applies a positive potential, relative to a potential of the electron emission source array, to the intermediate electrode and detects a current flowing in the intermediate electrode.

2. The image sensing device according to claim 1, wherein the intermediate electrode current detector detects a current flowing in the intermediate electrode corresponding to each of the electron emission sources arranged in the matrix in synchronization with a clock signal that is provided to perform dot sequential scanning of each of the electron emission sources.

3. The image sensing device according to claim 1, further comprising a residue hole identifier that identifies an electron emission source that emits a smaller amount of electrons than an amount of holes generated in the photoelectric conversion film based on both the current flowing in the intermediate electrode and the current flowing in the photoelectric conversion film.

4. The image sensing device according to claim 3, further comprising a driver controller that performs additional electron emission driving of an electron emission source identified by the residue hole identifier in a blanking period, the blanking period being a period other than an output period of the image signal.

5. The image sensing device according to claim 1, further comprising an emission electron amount determinator that determines an amount of electrons emitted by each of the electron emission sources based on both the current flowing in the intermediate electrode and the current flowing in the photoelectric conversion film.

6. The image sensing device according to claim 5, further comprising a signal interpolation processor that performs interpolation of image signal data corresponding to an electron emission source that emits a smaller amount of electrons than a prescribed value.

* * * * *